(12) United States Patent
Wakabayashi et al.

(10) Patent No.: US 7,719,116 B2
(45) Date of Patent: May 18, 2010

(54) SEMICONDUCTOR DEVICE HAVING REDUCED NUMBER OF EXTERNAL PAD PORTIONS

(75) Inventors: Takeshi Wakabayashi, Sayama (JP); Ichiro Mihara, Tachikawa (JP)

(73) Assignee: Casio Computer Co., Ltd., Tokyo (JP)

( * ) Notice: Subject to any disclaimer, the term of this patent is extended or adjusted under 35 U.S.C. 154(b) by 649 days.

(21) Appl. No.: 11/443,858

(22) Filed: May 31, 2006

(65) Prior Publication Data

US 2006/0273463 A1 Dec. 7, 2006

(30) Foreign Application Priority Data

Jun. 1, 2005 (JP) .............................. 2005-161026

(51) Int. Cl.
*H01L 23/48* (2006.01)
*H01L 23/52* (2006.01)
*H01L 29/40* (2006.01)

(52) U.S. Cl. .................. 257/773; 257/691; 257/737; 257/758; 257/775; 257/786

(58) Field of Classification Search .................. 257/773, 257/691, 737, 775, 786, 758
See application file for complete search history.

(56) References Cited

U.S. PATENT DOCUMENTS

| | | | | |
|---|---|---|---|---|
| 5,616,959 | A * | 4/1997 | Jeng | 257/758 |
| 6,150,727 | A * | 11/2000 | Takagi | 257/786 |
| 6,236,117 | B1 * | 5/2001 | Ishigaki et al. | 257/734 |
| 6,476,491 | B2 * | 11/2002 | Harada et al. | 257/758 |
| 6,624,514 | B2 * | 9/2003 | Kasai | 257/758 |
| 6,707,685 | B2 * | 3/2004 | Kabumoto et al. | 361/794 |
| 6,717,270 | B1 * | 4/2004 | Downey et al. | 257/758 |

(Continued)

FOREIGN PATENT DOCUMENTS

JP 2001-196374 A 7/2001

(Continued)

OTHER PUBLICATIONS

Japanese Office Action dated Jan. 6, 2009 (1 page), and English translation thereof (2 pages) issued in counterpart Japanese Application No. 2005-161026.

(Continued)

*Primary Examiner*—Leonardo Andújar
*Assistant Examiner*—Teresa M Arroyo
(74) *Attorney, Agent, or Firm*—Frishauf, Holtz, Goodman & Chick, P.C.

(57) ABSTRACT

A semiconductor device includes a semiconductor substrate having an integrated circuit, a first insulating film formed on the semiconductor substrate, at least one power source internal wiring line formed on the first insulating film, and a second insulating film formed on the first insulating film and on the internal wiring line and having a plurality of openings exposing parts of the internal wiring line. At least one wiring line is formed on an upper side of the second insulating film to correspond to the internal wiring line and electrically connected to the internal wiring line via the plurality of openings of the second insulating film. The wiring line has at least one external electrode pad portion whose number is smaller than the number of openings in the second insulating film.

20 Claims, 3 Drawing Sheets

U.S. PATENT DOCUMENTS

| | | | |
|---|---|---|---|
| 6,774,484 B2 * | 8/2004 | Mimino et al. | 257/728 |
| 6,888,253 B1 * | 5/2005 | Rogers et al. | 257/774 |
| 6,943,440 B2 | 9/2005 | Kim et al. | |
| 6,977,435 B2 | 12/2005 | Kim et al. | |
| 7,049,642 B2 * | 5/2006 | Shinjo | 257/207 |
| 2001/0004133 A1 * | 6/2001 | Ihara | 257/750 |
| 2003/0098512 A1 | 5/2003 | Bobba et al. | |
| 2004/0079966 A1 * | 4/2004 | Lin et al. | 257/200 |
| 2005/0051894 A1 * | 3/2005 | Kim et al. | 257/734 |
| 2005/0104177 A1 * | 5/2005 | Lin et al. | 257/678 |
| 2005/0173801 A1 * | 8/2005 | Mimura et al. | 257/758 |
| 2006/0012039 A1 | 1/2006 | Kim et al. | |
| 2006/0273463 A1 * | 12/2006 | Wakabayashi et al. | 257/773 |
| 2007/0264754 A1 * | 11/2007 | Jobetto | 438/114 |
| 2008/0044944 A1 * | 2/2008 | Wakisaka et al. | 438/106 |
| 2008/0073785 A1 * | 3/2008 | Shiota | 257/738 |
| 2009/0079073 A1 * | 3/2009 | Mizusawa et al. | 257/738 |
| 2009/0155982 A1 * | 6/2009 | Wakisaka et al. | 438/462 |
| 2009/0200665 A1 * | 8/2009 | Jobetto et al. | 257/737 |
| 2009/0243097 A1 * | 10/2009 | Koroku et al. | 257/737 |

FOREIGN PATENT DOCUMENTS

| | | |
|---|---|---|
| JP | 2002-141436 A | 5/2002 |
| KR | 2003-0007227 A | 1/2003 |
| WO | WO 2005/024912 A2 | 3/2005 |

OTHER PUBLICATIONS

Korean Office Action (and English translation thereof) dated Mar. 27, 2008, issued in a counterpart Korean Application.

Notification of Transmittal of the International Search Report and the Written Opinion of the International Searching Authority for PCT/JP2006/311166, 10 sheets.

* cited by examiner

US 7,719,116 B2

SEMICONDUCTOR DEVICE HAVING REDUCED NUMBER OF EXTERNAL PAD PORTIONS

CROSS-REFERENCE TO RELATED APPLICATIONS

This application is based upon and claims the benefit of priority from prior Japanese Patent Application No. 2005-161026, filed Jun. 1, 2005, the entire contents of which are incorporated herein by reference.

BACKGROUND OF THE INVENTION

1. Field of the Invention

This invention relates to a semiconductor device and a mounting structure thereof.

2. Description of the Related Art

Recently, in equipment such as personal computers and mobile devices, it has often been the case that, in order to reduce equipment size, a semiconductor device is flip-chip-mounted on a substrate. In this case, a method is employed, wherein a bare semiconductor substrate having an integrated circuit formed therein is directly provided with external electrode pads connected to the integrated circuit, and solder balls are formed on the external electrode pads, and then the solder balls are bonded to connection terminals of an external circuit board, thereby minimizing a mounting area (e.g., refer to Jpn. Pat. Appln. KOKAI Publication No. 2001-196374).

In the above-mentioned semiconductor device, a silicon oxide film is formed on a silicon substrate, and a plurality of through-holes are formed in the silicon oxide film and metal layers are provided in the through-holes. Then, a thin silicon layer is formed on the silicon oxide film, and an integrated circuit including P-type and/or N-type MOS transistors is formed in the silicon layer, and then an upper surface of the integrated circuit is covered with an interlayer insulating film. Subsequently, the silicon substrate is polished in its thickness direction from its lower side so that it completely removed to expose a lower surface of the silicon oxide film. Then, external electrode pad portions are formed at places corresponding to the through-holes provided in the silicon oxide film before solder balls are provided on the external electrode pad portions. In this manner, the external electrode pad portions and the solder balls are provided to correspond to one another in the metal layers connected to the integrated circuit via the through-holes.

Recently, semiconductor devices for control use driven at a high-speed clock of several gigahertz have emerged. It is necessary to supply a current of several tens of amperes from an external power source to such a semiconductor device. In this case, if the diameter of the solder balls provided on the external electrode pad portions is about 100 μm, a current of about 30 mA can only be passed to one solder ball in order to prevent the breakdown of the solder balls due to heat generation. Therefore, when a power source of a large current of several tens of amperes is required, a current passed to several thousand external electrode pad portions via several thousand solder balls converges inside.

For the purpose of, for example, face-down mounting to connection terminal portions of the external circuit board via the solder balls thus provided on a large number of external electrode pad portions, the size of the semiconductor device is significantly increased, which requires a large mounting area. Moreover, due to the large number of solder balls, a short-circuit occurs in a bonding step, and there is a great variation in the size of the solder balls, making it impossible to obtain reliability in connection.

BRIEF SUMMARY OF THE INVENTION

Therefore, this invention is directed to provide a semiconductor device and a mounting structure thereof in which the number of external electrode pad portions can be reduced to achieve a size reduction and an improvement of reliability in connection.

In order to achieve the above object, this invention provides a semiconductor device comprising:

a semiconductor substrate having an integrated circuit;

a first insulating film formed on the semiconductor substrate;

at least one power source internal wiring line formed on the first insulating film;

a second insulating film formed on the first insulating film and on the internal wiring line and having a plurality of openings exposing parts of the internal wiring line; and at least one wiring line formed on an upper side of the second insulating film to correspond to the internal wiring line and electrically connected to the internal wiring line via the plurality of openings of the second insulating film, wherein said at least one wiring line has at least one external electrode pad portion whose number is smaller than the number of openings in the second insulating film.

According to this invention, the wiring line for external connection is connected to the internal wiring line through a plurality of openings formed in the second insulating film. Thus, the number of the wiring line may be decreased in comparison with the prior art, to allow the semiconductor device to become smaller and higher reliability in connection.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

First Embodiment

Figure 1:
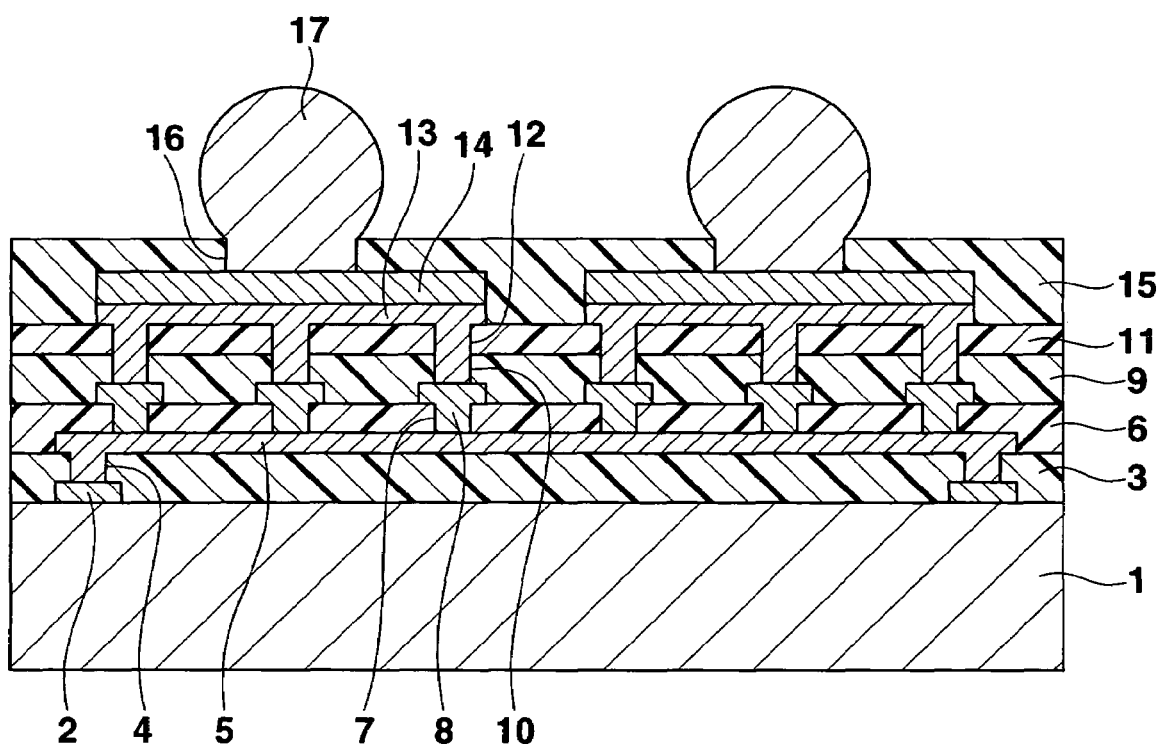
FIG. 1 is a sectional view of a semiconductor device as a first embodiment of this invention.

FIG. 1 shows a sectional view of a semiconductor device as a first embodiment of this invention. This semiconductor device includes a silicon substrate (semiconductor substrate) 1. An integrated circuit (not shown) having a predetermined function is provided in the center of an upper side of the silicon substrate 1, and a plurality of internal connection pads 2 made of a metal such as an aluminum-based metal are provided in peripheral parts of the upper surface in such a manner as to be electrically connected to the integrated circuit.

A first insulating film 3 made of silicon oxide, silicon nitride or the like is provided on the upper surfaces of the internal connection pads 2 and the silicon substrate 1. A plurality of openings 4 are formed, for example, in matrix-form arrangement, in the first insulating film 3 in parts corresponding to the centers of the upper surfaces of the internal connection pads 2. An internal wiring line 5 of about 1 µm in thickness made of copper or a copper alloy is provided on an upper surface of the first insulating film 3 in such a manner as to be electrically connected to the internal connection pads 2 via the openings 4 of the first insulating film 3.

Here, the internal wiring line 5 shown in FIG. 1 is an internal wiring line for grounding or for $V_{DD}$ (generically called "for power source"), and several to several ten internal wiring lines are provided in parallel and vertically spaced with each other to the surface of the drawing of FIG. 1. In FIG. 1, internal wiring lines for control signals and for data are omitted.

A second insulating film 6 made of silicon oxide, silicon nitride or the like is provided on the upper surfaces of the first insulating film 3 and the internal wiring lines 5. Openings 7 are formed in the second insulating film 6 in parts corresponding to a plurality (e.g., six) of connection pad portions of each of the internal wiring lines 5.

Connection pads 8 made of copper, a copper alloy or the like are provided in the openings 7 of the second insulating film 6 and on an upper surface of the second insulating film 6 in the vicinity or periphery of the openings 7 in such a manner as to be electrically connected to the connection pad portions of the internal wiring line 5. A third insulating film 9 made of silicon oxide, silicon nitride or the like is provided on the upper surfaces of the second insulating film 6 and the connection pads 8. Openings 10 are formed in the third insulating film 9 in parts corresponding to the centers of upper surfaces of the connection pads 8.

A protective film (insulating film) 11 made of a polyimide-based resin or the like is provided on an upper surface of the third insulating film 9. Openings 12 are formed in the protective film 11 in parts corresponding to the openings 10 of the third insulating film 9. Foundation metal or lower layers 13 made of copper or the like are provided on an upper surface of the protective film 11. A wiring line or upper layer 14 made of copper is provided on an entire upper surface of the foundation metal layer 13. In this case, the thickness of the wiring line 14 is larger than the thickness of the internal wiring line 5, and is preferably 2 to 10 µm. Each of the foundation metal layers 13 and each of the wiring lines 14 are connected to the plurality (e.g., three) of internal connection pads 2 via the plurality (e.g., three) of openings 12, 10 of the protective film 11 and the third insulating film 9. Here, in FIG. 1, part of the foundation metal layer 13 is only provided within the openings 10 formed in the third insulating film 9 and within the openings 12 formed in the protective film 11, but this is for figure convenience, and in practice, part of the wiring line 14 is also provided therein. Moreover, each of the foundation metal layers 13 and each of the wiring lines 14 are provided across the three respective openings 10 and 12, but this is also for figure convenience, and in practice, they are formed across several to several ten respective openings 10 and 12. The width of each of the wiring lines 14 is decided in accordance with a later-described current from an external power source supplied to the solder balls.

An overcoat film 15 made of a solder resist or the like is provided on upper surfaces of the wiring lines 14 and the protective film 11. In each of the wiring lines 14, a substantially central part in longitudinal and width directions thereof serves as an external electrode pad portion, and openings 16 are formed in the overcoat film 15 in parts corresponding to the external electrode pad portions. A solder ball 17 is provided within and above the opening 16 in such a manner as to be electrically connected to the external electrode pad portion of the wiring line 14.

As described above, in this semiconductor device, there are provided several to several ten internal wiring lines 5, and each of them is electrically connected to the plurality of internal connection pads 2. There are provided a number of connection pads 8 in each of the internal wiring lines 5. One wiring line 14 is connected to several to several ten connection pads 8. Each of the solder balls 17 is formed in one external electrode pad portion provided in each of the wiring lines 14.

Therefore, in this semiconductor device, the number of solder balls 17 for grounding or for power source corresponds to a few percent to several ten percent of the number of connection pads 8 for power source, so that the total number of solder balls 17 can be smaller than the total number of connection pads 8, thus making it possible to achieve a size reduction of the semiconductor device and an improvement of reliability in connection.

Here, a plurality of second wiring lines 14 are arranged to extend in the longitudinal direction of the internal or first wiring lines 5, and if both lines 5 and 14 have the same width, no space is wasted in terms of layout, allowing a reduction in the size of the semiconductor device. Here, since the sums of power source currents supplied to the first wiring lines 5 and the wiring second lines 14 via the electrode pad portions are equal, it is recommended that $$Ni/(To/Ti) \leq No \leq Ni((To/Ti)-1)$$

be satisfied, wherein Ni is the number of openings 10 or 12 corresponding to one second wiring line, No is the number of external electrode pad portions provided in one second wiring line (or the number of openings 16), Ti is the thickness of the first wiring line 5, and To is the thickness of the second wiring line 14 including the foundation metal layer 13.

Second Embodiment

Figure 2:
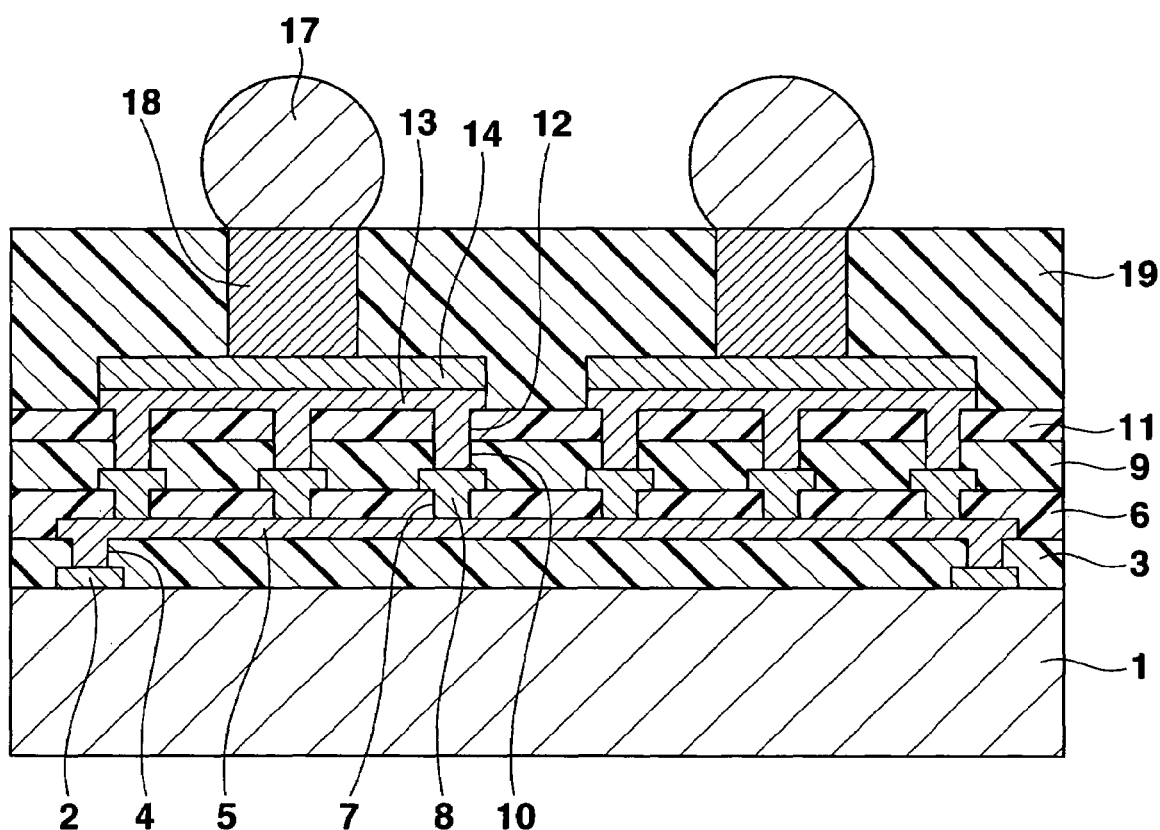
FIG. 2 is a sectional view of a semiconductor device as a second embodiment of this invention.

FIG. 2 shows a sectional view of a semiconductor device as a second embodiment of this invention. This semiconductor device is different from the semiconductor device shown in FIG. 1 in that a columnar electrode 18 made of copper is provided on an upper surface of an external electrode pad portion of a second wiring line 14, and a sealing film 19 made of an epoxy-based resin or the like is provided on an upper surface of a protective film 11 including the wiring line 14 so that an upper surface of the sealing film 19 may form one surface with upper surfaces of the columnar electrodes 18, and then a solder ball 17 is provided on the upper surface of the columnar electrode 18.

In this semiconductor device, when so-called low-k is used as a material for first and second insulating films (interlayer insulating films) 3 and 6, the specific inductive capacity and elasticity modulus of the first and second insulating films 3 and 6 are in a trade-off relation. If the specific inductive capacity is reduced, a very fragile material having an elasticity modulus of 5 Gpa or less is used. In this case, in general, when the semiconductor device comprising the columnar electrodes 18 is mounted on a circuit board (not shown), cracks may be easily caused in the first and second insulating films 3 and 6 by stress due to a difference of thermal expansion coefficients between a silicon substrate 1 and the circuit board.

However, in the second embodiment, since the total number of solder balls 17 can be smaller than the total number of connection pads 8 to increase the size of the solder balls 17, it is possible to reduce the stress due to the difference of thermal expansion coefficients between the silicon substrate 1 and the circuit board. Therefore, even if the so-called low-k which has an elasticity modulus of 5 Gpa or less and is thus very fragile is used as the material for first and second insulating films 3 and 6, it is possible to prevent the cracks from being easily caused in the first and second insulating films 3 and 6.

In the embodiments described above, one external electrode pad portion is provided in each of the second wiring lines 14 provided for several to several ten connection pads 8, but the number of external electrode pad portions provided in each of the wiring lines 14 is not necessarily limited to one, and a plurality of external electrode pad portions may be provided as long as the number thereof is smaller than the number of connection pads. One solder ball 17 is formed under the wiring line 14.

Figure 3:
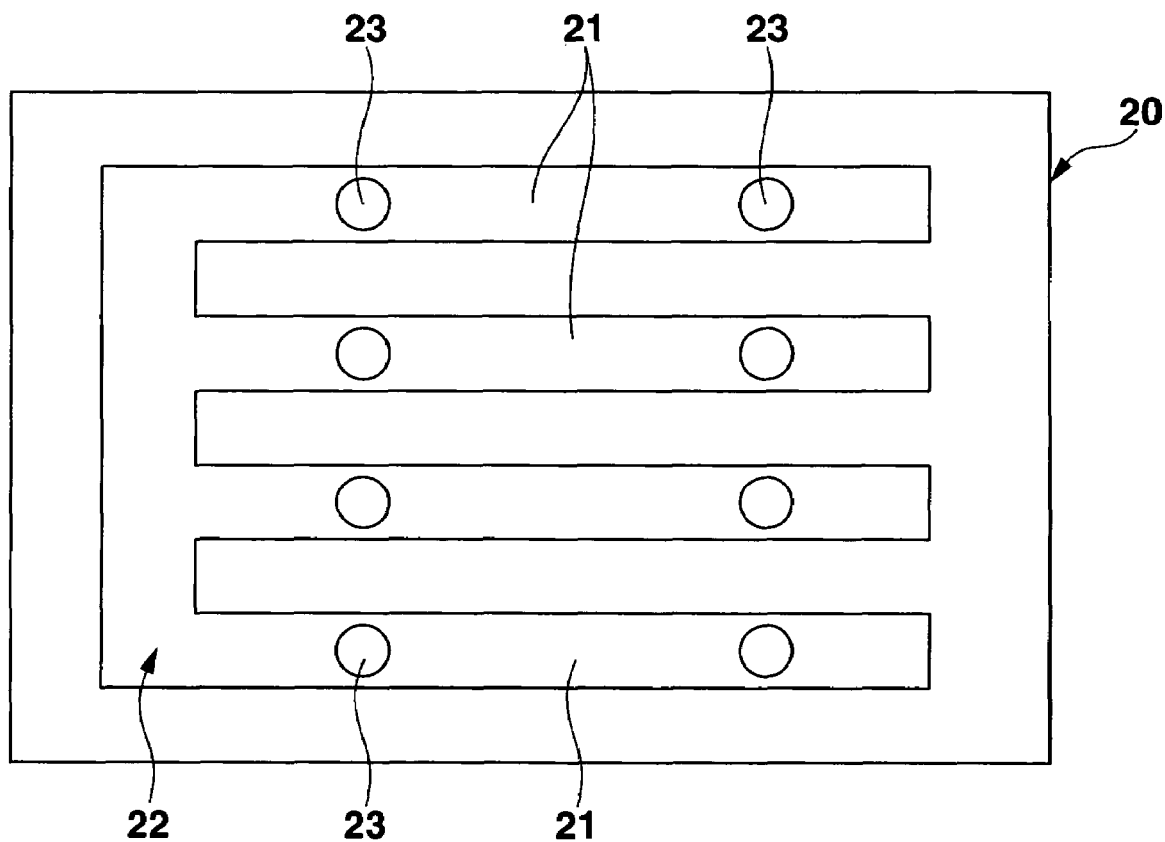
FIG. 3 is a plan view showing one embodiment of a circuit board to which the semiconductor device of this invention is connected.

FIG. 3 is a plan view of an external circuit board 20 to which the aforementioned semiconductor device is to be mounted face down. A power source wiring line pattern 22 is provided on one surface of the circuit board 20. The power source wiring line pattern 22 is a pattern which interconnects a plurality of feeder lines 21 arranged in parallel to correspond to the internal wiring lines 5, and each of the feeder lines 21 is provided with connection terminal portions 23 corresponding to the external electrode pad portions of the wiring line 14 of the semiconductor device. The solder balls 17 provided on the external electrode pad portions are aligned with the connection terminal portions 23 of the circuit board 20 to mount the semiconductor device face down by bonding. Although not shown in the figure, the power source wiring line pattern 22 of the circuit board 20 is desirably covered with a resist except for the connection terminal portions.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device comprising:
    a semiconductor substrate having an integrated circuit which includes a plurality of internal connection pads;
    a first insulating film formed on the semiconductor substrate and having a plurality of first openings each of which corresponds to one of the internal connection pads, respectively;
    at least one power source internal wiring line formed on the first insulating film and connected to the internal connection pads via the first openings;
    a second insulating film formed on the first insulating film and on the internal wiring line and having a plurality of second openings exposing parts of the internal wiring line, the number of the second openings in the second insulating film being larger than the number of the first openings in the first insulating film; and
    a plurality of wiring lines which are formed on an upper side of the second insulating film to correspond to the internal wiring line and which are electrically connected to the internal wiring line via the plurality of second openings of the second insulating film, each of the wiring lines having a thickness in a vertical direction that is thicker than a thickness in the vertical direction of the internal wiring line and a length in a first horizontal direction that is shorter than a length in the first horizontal direction of the internal wiring line;
    wherein each of the wiring lines has at least one external electrode pad portion whose number is smaller than a number of second openings in the second insulating film; and
    wherein a solder ball is provided on the at least one external electrode pad portion of each of the wiring lines.

2. The semiconductor device according to claim 1, further comprising connection pads provided in the second openings of the second insulating film covering an upper surface of the internal wiring line and a periphery of the second openings on the second insulating film.

3. The semiconductor device according to claim 2, wherein the wiring lines are formed in contact with the connection pads.

4. The semiconductor device according to claim 3, wherein the second insulating film includes a first layer formed between the connection pads, and a second layer provided on the first layer and having third openings formed at positions corresponding to the connection pads.

5. The semiconductor device according to claim 4, wherein the second layer has a layer structure having a plurality of layers.

6. The semiconductor device according to claim 1, wherein the wiring lines and the internal wiring line are made of copper.

7. The semiconductor device according to claim 1, wherein the elasticity modulus of at least one of the first and second insulating films is 5 GPa or less.

8. The semiconductor device according to claim 1, wherein the wiring lines and the internal wiring line have a same width in a second horizontal direction that is perpendicular to the first horizontal direction.

9. The semiconductor device according to claim 1, wherein the plurality of wiring lines are arranged along the internal wiring line in the first horizontal direction.

10. The semiconductor device according to claim 9, wherein $Ni/(To/Ti) \leq No \leq Ni((To/Ti)-1)$ is satisfied, where Ni is the number of the second openings, No is the number of external electrode pad portions provided in the wiring lines, Ti is the thickness of the internal wiring line, and To is the thickness of the wiring lines.

11. The semiconductor device according to claim 1, wherein the first insulating film is made of low-k.

12. The semiconductor device according to claim 1, wherein the second insulating film includes low-k.

13. The semiconductor device according to claim 2, wherein each of the connection pads is independently formed so as not to be electrically connected to each other.

14. The semiconductor device according to claim 4, wherein:
    the second insulating film includes a third layer formed on the second layer;
    the third layer has a fourth opening; and electrical conductors are formed in the third openings and the fourth openings so as not to be electrically connected at a boundary between the second layer and the third layer.

15. A mounting structure comprising:
a semiconductor device which includes: (i) a semiconductor substrate having an integrated circuit which includes a plurality of internal connection pads; (ii) a first insulating film formed on the semiconductor substrate and having a plurality of first openings each of which corresponds to one of the internal connection pads, respectively; (iii) at least one power source internal wiring line formed on the first insulating film and connected to the internal connection pads via the first openings; (iv) a second insulating film formed on the first insulating film and on the internal wiring line and having a plurality of second openings exposing parts of the internal wiring line, the number of the second openings in the second insulating film being larger than the number of the first openings in the first insulating film; and (v) a plurality of wiring lines which are formed on an upper side of the second insulating film to correspond to the internal wiring line and which are electrically connected to the internal wiring line via the plurality of second openings of the second insulating film, each of the wiring lines having a thickness in a vertical direction that is thicker than a thickness in the vertical direction of the internal wiring line and a length in a horizontal direction that is shorter than a length in the horizontal direction of the internal wiring line; and wherein each of the wiring lines has at least one external electrode pad portion whose number is smaller than a number of the second openings formed in the second insulating film;
a substrate having a power source pattern with at least one power source terminal portion corresponding to the at least one external electrode pad portion of each of the wiring lines; and
a solder layer bonding the at least one external electrode pad portion to the power source terminal portion of the power source pattern.

16. The mounting structure according to claim 15, wherein the plurality of wiring lines are arranged along the internal wiring line in the horizontal direction.

17. The mounting structure according to claim 16, wherein $Ni/(To/Ti) \leqq No \leqq Ni((To/Ti)-1)$ is satisfied, where Ni is the number of the second openings, No is the number of external electrode pad portions provided in the wiring lines, Ti is the thickness of the internal wiring line, and To is the thickness of the wiring lines.

18. The mounting structure according to claim 15, wherein a columnar electrode is formed on the at least one external electrode pad portion of each of the wiring lines.

19. The mounting structure according to claim 18, wherein a sealing film is provided around the columnar electrode, on the second insulating film.

20. A semiconductor device comprising:
a semiconductor substrate having an integrated circuit which includes a plurality of internal connection pads;
a first insulating film formed on the semiconductor substrate and having a plurality of first openings each of which corresponds to one of the internal connection pads, respectively;
at least one power source internal wiring line formed on the first insulating film and connected to the internal connection pads via the first openings;
a second insulating film formed on the first insulating film and on the internal wiring line and having a plurality of second openings exposing parts of the internal wiring line, the number of the second openings in the second insulating film being larger than the number of the first openings in the first insulating film; and
a plurality of wiring lines which are formed on an upper side of the second insulating film to correspond to the internal wiring line and which are electrically connected to the internal wiring line via the plurality of second openings of the second insulating film, each of the wiring lines having a thickness in a vertical direction that is thicker than a thickness in the vertical direction of the internal wiring line and a length in a horizontal direction that is shorter than a length in the horizontal direction of the internal wiring line;
wherein each of the wiring lines has at least one external electrode pad portion whose number is smaller than a number of second openings in the second insulating film; and
wherein a columnar electrode is provided on the at least one external electrode pad portion of each of the wiring lines, and a solder ball is provided on the columnar electrode.

* * * * *